(12) United States Patent
Huang et al.

(10) Patent No.: US 11,462,534 B2
(45) Date of Patent: Oct. 4, 2022

(54) SEMICONDUCTOR DEVICE AND MANUFACTURING METHOD THEREOF

(71) Applicant: TAIWAN SEMICONDUCTOR MANUFACTURING CO., LTD., Hsinchu (TW)

(72) Inventors: Chung-Pin Huang, New Taipei (TW); Hou-Yu Chen, Hsinchu County (TW); Chuan-Li Chen, Yunlin County (TW); Chih-Kuan Yu, Nantou County (TW); Yao-Ling Huang, Zhubei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 17/105,963

(22) Filed: Nov. 27, 2020

(65) Prior Publication Data

US 2021/0104518 A1   Apr. 8, 2021

Related U.S. Application Data

(60) Continuation of application No. 16/396,931, filed on Apr. 29, 2019, now Pat. No. 10,854,599, which is a (Continued)

(51) Int. Cl.
*H01L 27/088* (2006.01)
*H01L 29/66* (2006.01)
(Continued)

(52) U.S. Cl.
CPC .... *H01L 27/088* (2013.01); *H01L 21/823425* (2013.01); *H01L 21/823431* (2013.01);
(Continued)

(58) Field of Classification Search
CPC .......... H01L 27/088; H01L 21/823425; H01L 21/823431; H01L 21/823468;
(Continued)

(56) References Cited

U.S. PATENT DOCUMENTS 9,397,003 B1    7/2016 Niimi et al.
2015/0035061 A1*  2/2015 Yoon ................. H01L 29/66545
                                                                   257/365

(Continued)

*Primary Examiner* — Jonathan Han
(74) *Attorney, Agent, or Firm* — Birch, Stewart, Kolasch & Birch, LLP

(57) ABSTRACT

A device comprises a first transistor disposed within a first device region of a substrate and a second transistor disposed within a second device region of the substrate. The first transistor comprises first source/drain regions, a first gate structure laterally between the first source/drain regions, and first gate spacers respectively on opposite sidewalls of the first gate structure. The second transistor comprises second source/drain regions, a second gate structure laterally between the second source/drain regions, and second gate spacers respectively on opposite sidewalls of the second gate structure. The second source/drain regions of the second transistor have a maximal width greater than a maximal width of the first source/drain regions of the first transistor, but the second gate spacers of the second transistor have a thickness less than a thickness of the first gate spacers.

20 Claims, 10 Drawing Sheets

Related U.S. Application Data division of application No. 15/629,904, filed on Jun. 22, 2017, now Pat. No. 10,276,565.

(60) Provisional application No. 62/475,302, filed on Mar. 23, 2017.

(51) Int. Cl.
  *H01L 29/78* (2006.01)
  *H01L 21/265* (2006.01)
  *H01L 21/8234* (2006.01)

(52) U.S. Cl.
  CPC .. *H01L 21/823468* (2013.01); *H01L 27/0886* (2013.01); *H01L 29/6653* (2013.01); *H01L 29/66545* (2013.01); *H01L 29/66795* (2013.01); *H01L 29/785* (2013.01); *H01L 29/7848* (2013.01); *H01L 21/26506* (2013.01)

(58) Field of Classification Search
  CPC ............. H01L 27/0886; H01L 29/6653; H01L 29/66545; H01L 29/66795; H01L 29/7848; H01L 29/785; H01L 21/26506; H01L 21/823821
  USPC .......................................................... 438/675
  See application file for complete search history.

(56) References Cited

U.S. PATENT DOCUMENTS

| | | | |
|---|---|---|---|
| 2015/0249036 A1* | 9/2015 | Cai | H01L 23/485 257/382 |
| 2016/0181399 A1* | 6/2016 | Jun | H01L 29/165 438/294 |
| 2016/0276449 A1 | 9/2016 | Bae et al. | |
| 2017/0222014 A1* | 8/2017 | Tak | H01L 21/76897 |

* cited by examiner

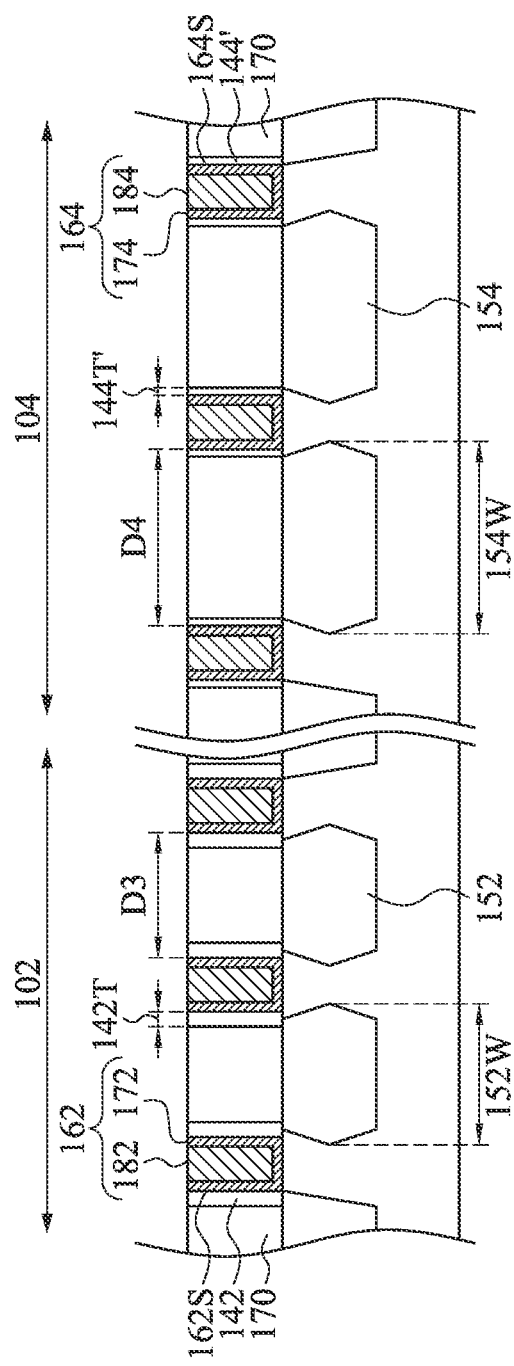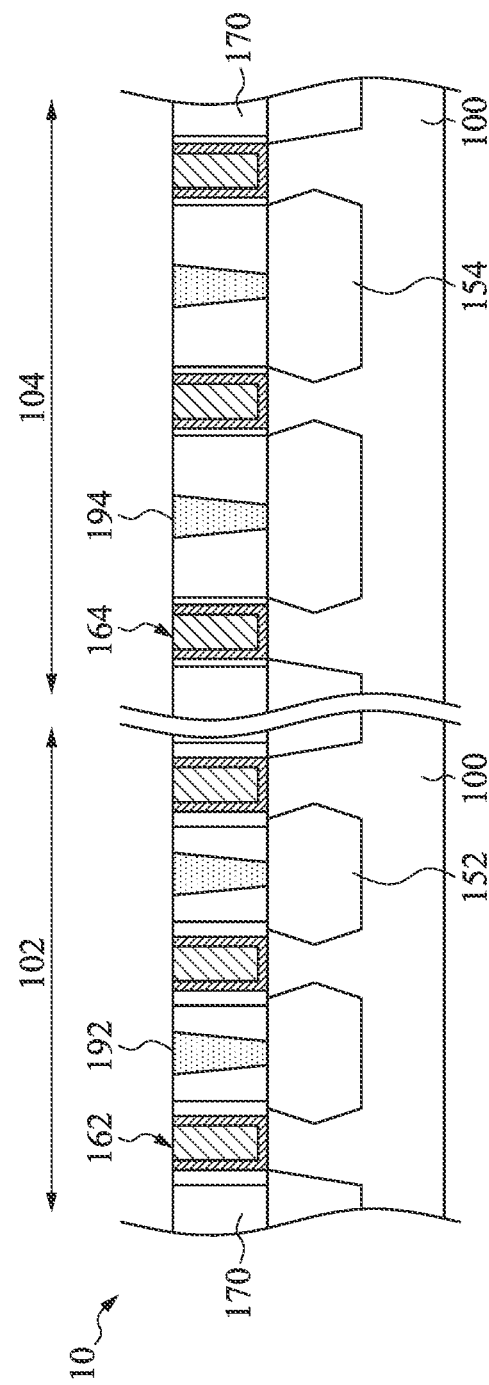

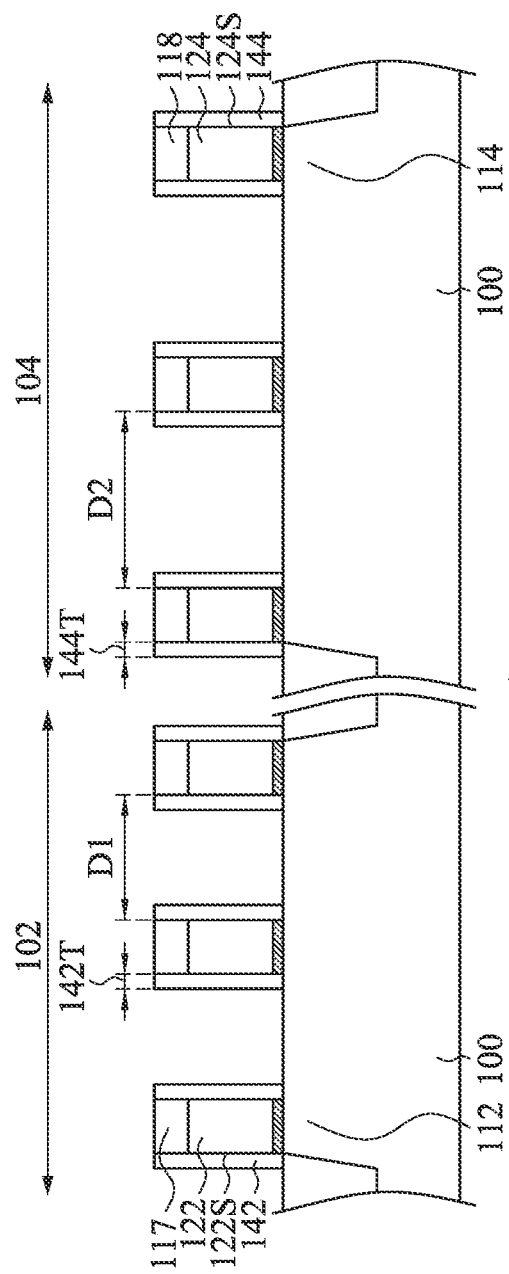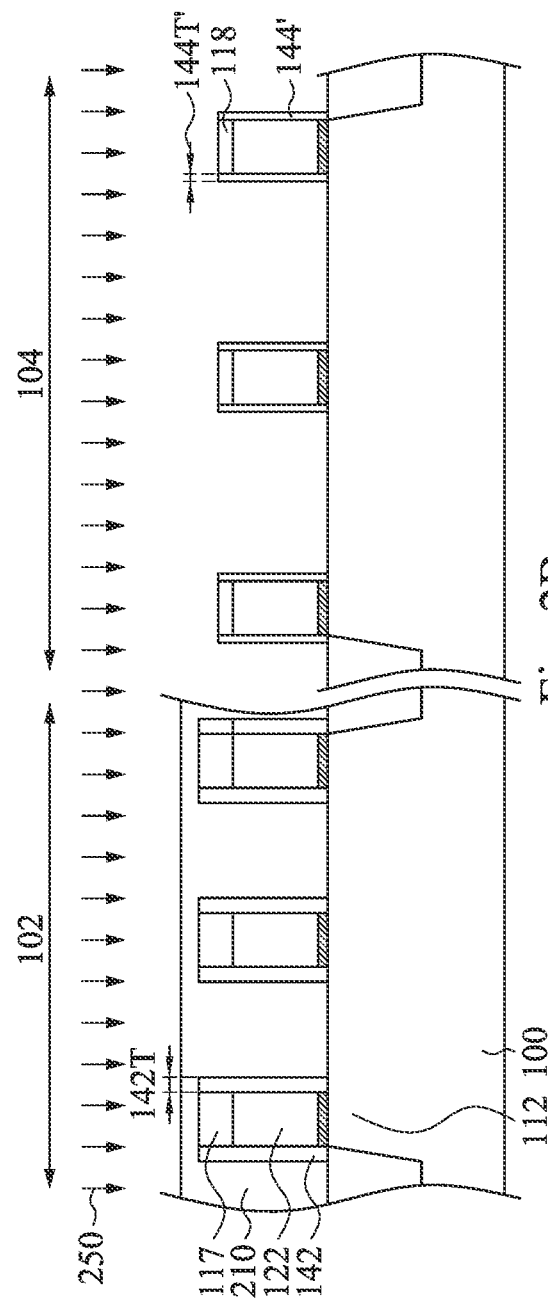
Fig. 2A
Fig. 2B

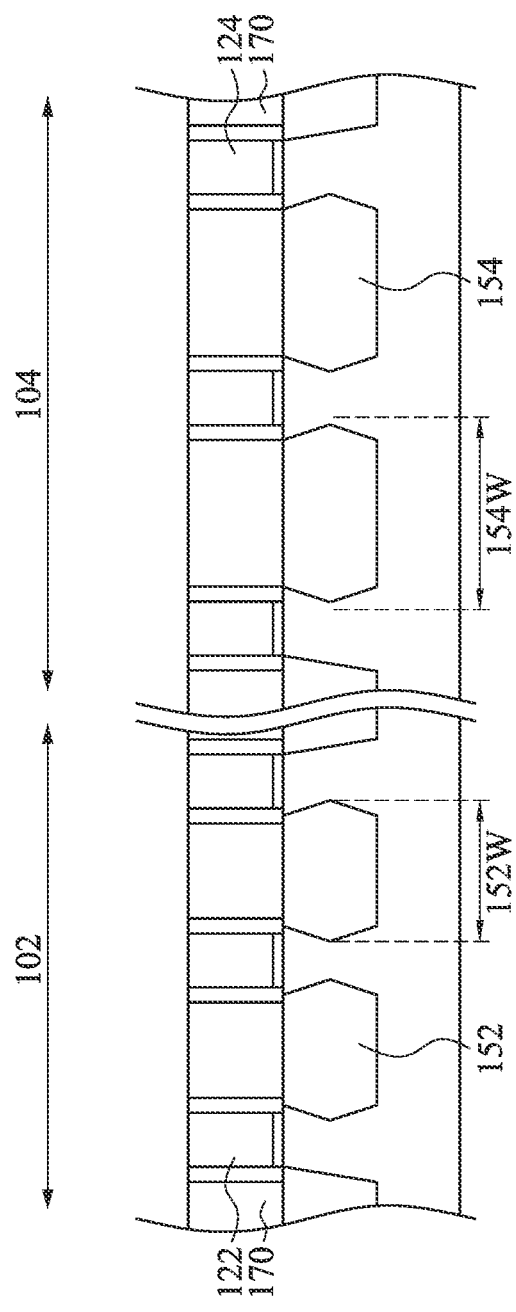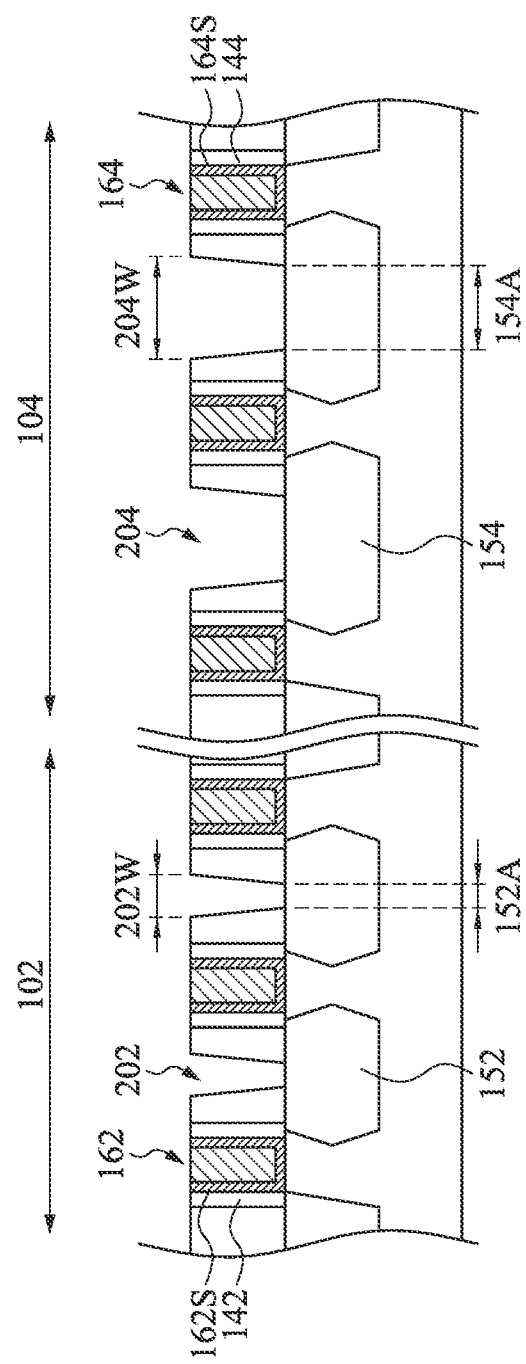

SEMICONDUCTOR DEVICE AND MANUFACTURING METHOD THEREOF

CROSS-REFERENCE TO RELATED APPLICATION

The present application is a Continuation application of U.S. application Ser. No. 16/396,931, filed on Apr. 29, 2019, now U.S. Pat. No. 10,854,599, issued on Dec. 1, 2020, which is a Divisional application of U.S. application Ser. No. 15/629,904, filed on Jun. 22, 2017, now U.S. Pat. No. 10,276,565, issued on Apr. 30, 2019, which claims priority of U.S. Provisional Application Ser. No. 62/475,302, filed Mar. 23, 2017, all of which are herein incorporated by reference in their entireties.

BACKGROUND

As the semiconductor industry has progressed into nanometer technology process nodes in pursuit of higher device density, higher performance, and lower costs, challenges from both fabrication and design issues have resulted in the development of three-dimensional designs, such as a fin field effect transistor (FinFET). FinFET devices are a type of multi-gate structure that include semiconductor fins with high aspect ratios and in which channel and source/drain regions of semiconductor transistor devices are formed. A gate is formed over and along the sides of the fin structure (e.g., wrapping) utilizing the increased surface area of the channel and source/drain regions to produce fast, reliable and well-controlled semiconductor transistor devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1A to 1H are cross-sectional views of a method for manufacturing a semiconductor device at various stages in accordance with some embodiments of the present disclosure.

FIGS. 2A to 2E are cross-sectional views of a method for manufacturing a semiconductor device at various stages in accordance with some embodiments of the present disclosure.

FIGS. 3A to 3E are cross-sectional views of a method for manufacturing a semiconductor device at various stages in accordance with some embodiments of the present disclosure.

DETAILED DESCRIPTION

Figure 1A:
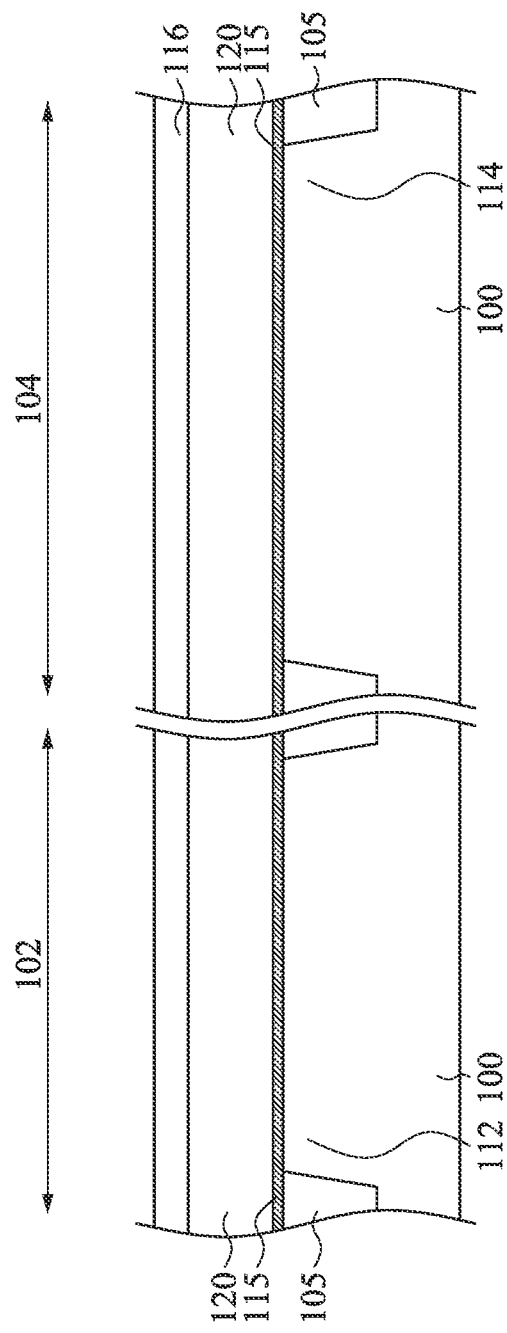

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Examples of structures that can be improved from one or more embodiments of the present application are semiconductor devices. Such a device, for example, is a Fin field effect transistor (FinFET) device. The following disclosure will continue with a FinFET example to illustrate various embodiments of the present application. It is understood, however, that the application should not be limited to a particular type of device.

FIGS. 1A to 1H are cross-sectional views of a method for manufacturing a semiconductor device at various stages in accordance with some embodiments of the present disclosure.

Reference is made to FIG. 1A. A substrate 100 is provided. The substrate 100 has at least one first device region 102 and at least one second device region 104. For example, in FIG. 1A, the substrate 100 has one first device region 102 and one second device region 104. In some embodiments, the first device region 102 may be a core device, and the second device region 104 may be an input/output (I/O) device.

The substrate 100 may be a bulk silicon substrate. Alternatively, the substrate 100 may include an elementary semiconductor, such as silicon (Si) or germanium (Ge) in a crystalline structure; a compound semiconductor, such as silicon germanium (SiGe), silicon carbide (SiC), gallium arsenic (GaAs), gallium phosphide (GaP), indium phosphide (InP), indium arsenide (InAs), and/or indium antimonide (InSb); or combinations thereof. Possible substrates 100 also include a silicon-on-insulator (SOI) substrate. SOI substrates are fabricated using separation by implantation of oxygen (SIMOX), wafer bonding, and/or other suitable methods.

Some exemplary substrates 100 also include an insulator layer. The insulator layer includes suitable materials, including silicon oxide, sapphire, and/or combinations thereof. An exemplary insulator layer may be a buried oxide layer (BOX). The insulator is formed by one or more suitable process(es), such as implantation (e.g., SIMOX), oxidation, deposition, and/or other suitable process. In some exemplary semiconductor substrate 100, the insulator layer is a component (e.g., layer) of a silicon-on-insulator substrate.

The substrate 100 may also include various doped regions. The doped regions may be doped with p-type dopants, such as boron or $BF_2$; n-type dopants, such as phosphorus or arsenic; or combinations thereof. The doped regions may be formed directly on the substrate 100, in a P-well structure, in an N-well structure, in a dual-well structure, and/or using a raised structure. The substrate 100 may further include various active regions, such as regions configured for an N-type metal-oxide-semiconductor transistor device and regions configured for a P-type metal-oxide-semiconductor transistor device.

A semiconductor fin 112 and a semiconductor fin 114 are formed on the substrate 100. The semiconductor fin 112 is formed on the first device region 102 (core region) of the substrate 100, and the semiconductor fin 114 is formed on the second device region 104 (I/O region) of the substrate 100. In some embodiments, the semiconductor fins 112 and 114 include silicon. The semiconductor fins 112 and 114 may be formed, for example, by patterning and etching the substrate 100 using photolithography techniques. In some embodiments, one or more layer(s) of photoresist material (not shown) are sequentially deposited over the substrate 100. The layer of photoresist material is irradiated (exposed) in accordance with a desired pattern (the semiconductor fins 112 and 114 in this case) and developed to remove portions of the photoresist material. The remaining photoresist material protects the underlying material from subsequent processing steps, such as etching. It should be noted that other masks, such as an oxide or silicon nitride mask, may also be used in the etching process.

The semiconductor fin 112 and 114 may be patterned by any suitable method. For example, the semiconductor fin 112 and 114 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

A plurality of isolation structures 105 are formed on the substrate 100 and adjacent to the semiconductor fins 112 and 114. The isolation structures 105, which act as a shallow trench isolation (STI) around the semiconductor fins 112 and 114 may be formed by chemical vapor deposition (CVD) techniques using tetra-ethyl-ortho-silicate (TEOS) and oxygen as a precursor. In yet some other embodiments, the isolation structures 105 are insulator layers of a SOI wafer.

A gate dielectric 115, a dummy gate material layer 120, and a mask layer 116 are deposited sequentially over the substrate 100 by, for example, low pressure CVD (LPCVD) and plasma enhanced (PECVD). The gate dielectric 115 may be formed by thermal oxidation, chemical vapor deposition, sputtering, or other methods known and used in the art for forming a gate dielectric. The gate dielectric 115 may include, for example, a high-k dielectric material such as metal oxides, metal nitrides, metal silicates, transition metal-oxides, transition metal-nitrides, transition metal-silicates, oxynitrides of metals, metal aluminates, zirconium silicate, zirconium aluminate, or combinations thereof. The dummy gate material layer 120 may include polycrystalline-silicon (poly-Si) or poly-crystalline silicon-germanium (poly-SiGe). Further, the dummy gate material layer 120 may be doped poly-silicon with uniform or non-uniform doping. The mask layer 116 may include silicon nitride (SiN), silicon oxynitride (SiON), silicon carbide (SiC), SiOC, spin-on glass (SOG), a low-K film, tetraethylorthosilicate (TEOS), plasma enhanced CVD oxide (PE-oxide), high-aspect-ratio-process (HARP) formed oxide, amorphous carbon material, tetraethylorthosilicate (TEOS), other suitable materials, and/or combinations thereof.

Figure 1B:
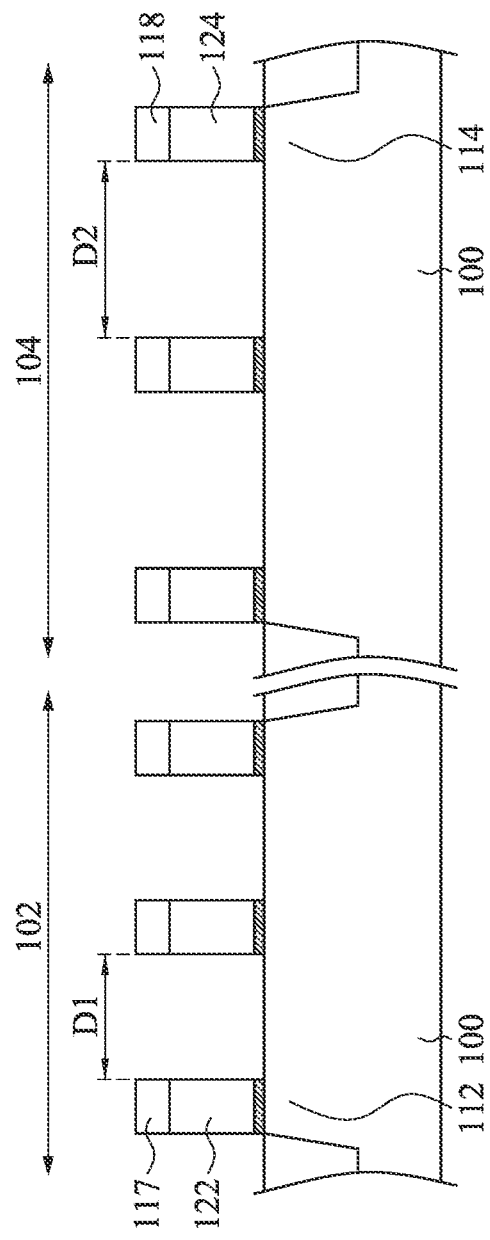

Reference is made to FIG. 1B. A patterned mask (not shown) is formed over the mask layer 116. The patterned mask defines a profile of a gate stacks (formed in later steps) disposed on the semiconductor fin 112 and 114. The mask layer 116, the dummy gate material layer 120, and the gate dielectric 115 of FIG. 1A disposed on the substrate 100 are then patterned with the patterned mask to form a plurality of first dummy gates 122 in the first device region 102 of the substrate 100, and a plurality of second dummy gates 124 in the second device region 104 of the substrate 100, respectively. For example, in FIG. 1B, the numbers of first dummy gates 122 and the second dummy gates 124 are three. The first dummy gates 122 and the second dummy gates 124 are formed such that a distance D1 between two adjacent first dummy gates 122 is smaller than a distance D2 between two adjacent second dummy gates 124. In other words, the spacing between two adjacent first dummy gates 122 is smaller than the spacing between two adjacent second dummy gates 124. In some embodiments, the distance D2 is 3% lager than the distance D1. The mask layer 116 of FIG. 1A is also patterned to form a plurality of first masks 117 and second masks 118, in which the first mask 117 cover the first dummy gates 122, and the second masks 118 cover the second dummy gates 124, respectively.

The dummy gate material layer 120, the mask layer 116, and the gate dielectric 115 of FIG. 1A may be patterned by an etching process, such as a dry plasma etching process or a wet etching process. At least one parameter, such as etchant, etching temperature, etching solution concentration, etching pressure, source power, radio frequency (RF) bias voltage, etchant flow rate, of the patterning (or etching) recipe can be tuned.

Figure 1C:
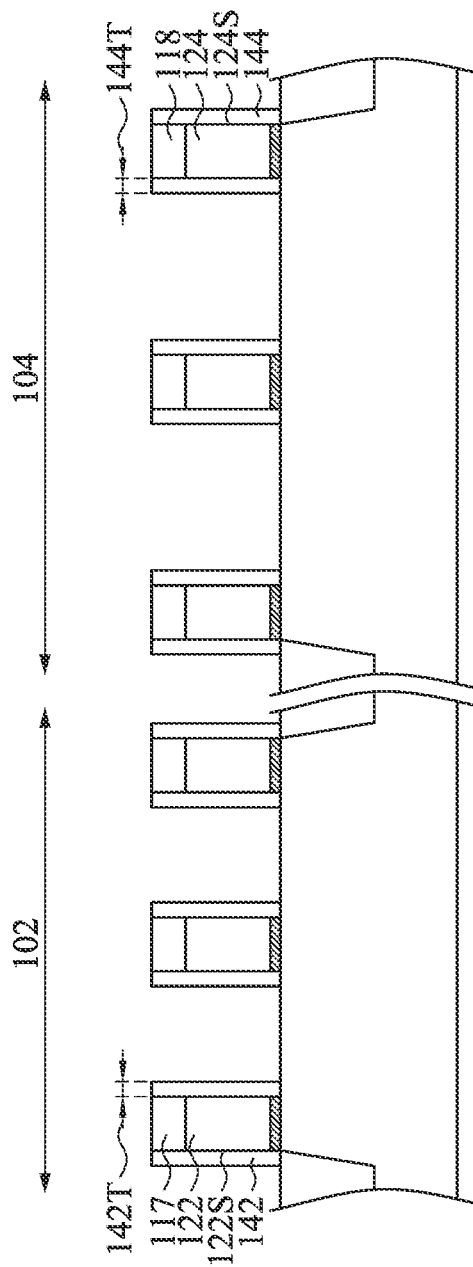

Reference is made to FIG. 1C. A plurality of first gate spacers 142 and second gate spacers 144 are formed on opposite sidewalls 122S of the first dummy gates 122 and opposite sidewalls 124S of the second dummy gates 124, respectively. The first gate spacers 142 and the second gate spacers 144 have a first thickness 142T and a second thickness 144T, respectively, in which the first thickness 142T is substantially equal to the second thickness 144T. The term "substantially" as used herein may be applied to modify any quantitative representation which could permissibly vary without resulting in a change in the basic function to which it is related.

In some embodiments, at least one of the gate spacers 142 and 144 includes single or multiple layers. The gate spacers 142 and 144 can be formed by blanket depositing one or more dielectric layer(s) (not shown) on the previously formed structure. The dielectric layer(s) may include silicon nitride (SiN), oxynitride, silicon carbon (SiC), silicon oxynitride (SiON), oxide, and the like and may be formed by methods utilized to form such a layer, such as CVD, plasma enhanced CVD, sputter, and other methods known in the art. The gate spacers 142 and 144 may include different materials with different etch characteristics than the dummy gates 122 and 124 so that the gate spacers 142 and 144 may be used as masks for the patterning of the dummy gates 122 and 124. The gate spacers 142 and 144 may then be patterned, such as by one or more etch(es) to remove the portions of the gate spacers 142 and 144 from the horizontal surfaces of the structure.

Figure 1D:
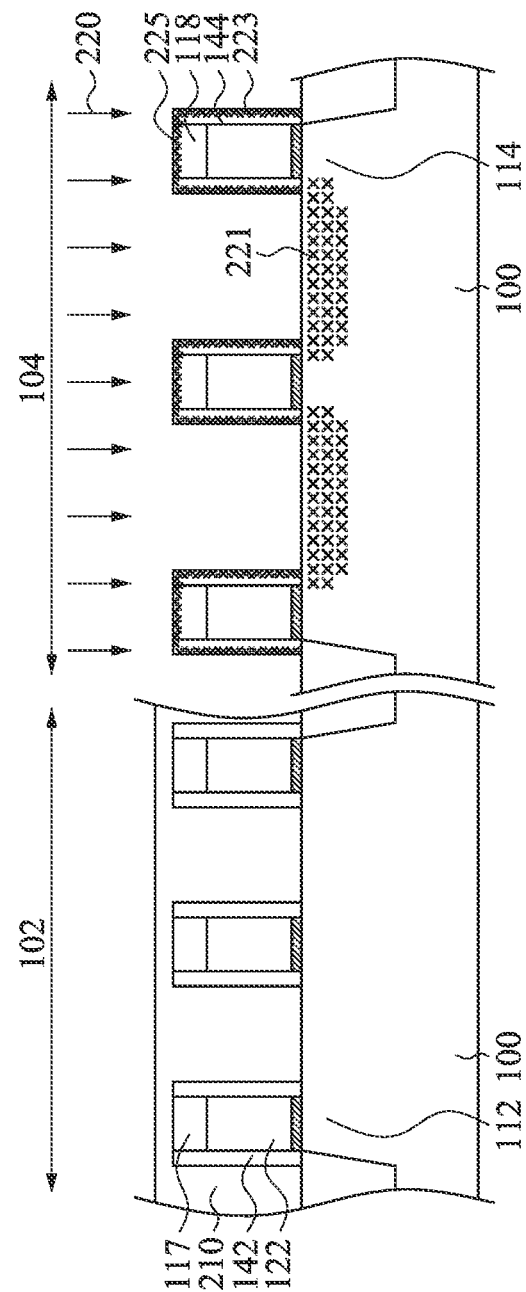

Reference is made to FIG. 1D. A mask layer 210 is formed over the first device region 102 of the substrate 100, such that the second device region 104 of the substrate 100 is exposed. In some embodiments, the mask layer 210 covers and protects the semiconductor fin 112, the first dummy gates 122, and the gate spacers 142. The mask layer 210 can be a resist layer, which is also referred to as a photoresist layer, photosensitive layer, imaging layer, patterning layer, or radiation sensitive layer. The mask layer 210 includes a positive-type resist material, a negative-type resist material, other type material, or combinations thereof. The mask layer 210 is formed on the first device region 102 of the substrate 100 by a lithography process. The lithography process includes resist coating (for example, spin-on coating), soft baking, mask aligning, exposure, post-exposure baking, developing the resist, rinsing, drying (for example, hard baking), other suitable processes, or combinations thereof. Alternatively, the lithography process is implemented or replaced by other methods, such as maskless lithography, electron-beam writing, or ion-beam writing. In yet another alternative, the lithography process implements nanoimprint technology to pattern the mask layer 210. In some embodiments, the lithography process implements an etching process, such as a dry etching, wet etching, other etching method, or combinations thereof. A rinsing process, such as a de-ionized (DI) water rinse, may be performed on the first device region 102 of the substrate 100 before forming the mask layer 210.

An implantation process 220 is performed to the second device region 104 of the substrate 100. In some embodiments, the implantation process 220 is performed to the semiconductor fin 114 and the second gate spacers 144. During the implantation process 220, a plurality of implantation regions 221, 223, and 225 are formed respectively on surface portions of the semiconductor fin 114, the second gate spacers 144, and the second masks 118. In some embodiments, the implantation process 220, the implantation species includes nitrogen (N), fluorine (F), argon (Ar), germanium (Ge), boron (B), indium (In), and carbon (C).

Figure 1E:
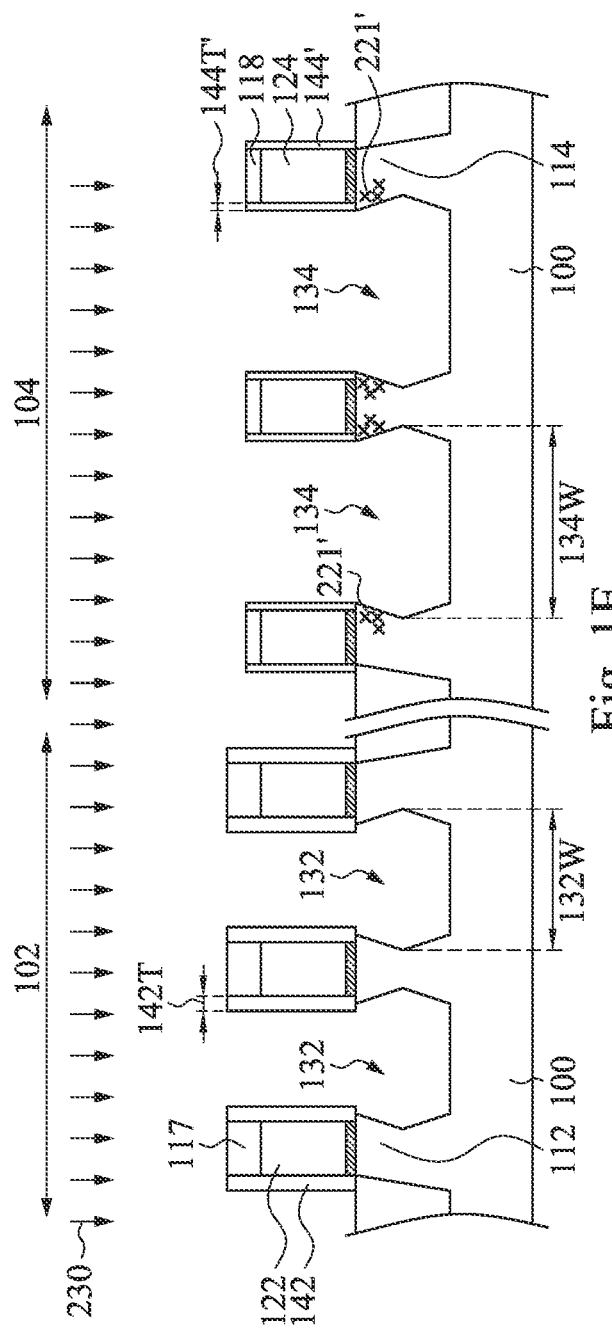

Reference is made to FIG. 1E. The mask layer 210 (see FIG. 1D) is removed to expose the first device region 102 of the substrate 100. An etching process 230 is performed to the first device region 102 and the second device region 104 of the substrate 100, and a plurality of recesses 132 and 134 are formed respectively in the first device region 102 and the second device region 104. One of the recesses 132 having a width 132W is formed between two adjacent first dummy gates 122 and in the semiconductor fin 112 of the substrate 100, and one of the recesses 134 having a width 134W is formed between two adjacent second dummy gates 124 and in the semiconductor fin 114 of the substrate 100. Since the spacing between the two adjacent first dummy gates 122 is smaller than the spacing between the two adjacent second dummy gates 124, the width 132W of the recesses 132 is smaller than the width 134W of the recesses 134.

During the etching process 230, the implantation regions 223 and 225 formed on the surface portions of the second gate spacers 144 and the second masks 118 of FIG. 1D are also removed. In other words, the second gate spacers 144 and the second masks 118 are partially removed. The formation of the recesses 134 and the partial removal of the second gate spacers 144 are performed simultaneously during the etching process 230. From another perspective, the implantation region 221, 223, and 225 in FIG. 1D increase the etching rate of the second device region 104. Accordingly, the second gate spacers 144 are shrunk by removing the implantation regions 223. Thus, the shrunk second gate spacers 144' have a second thickness 144T', in which the second thickness 144T' of the shrunk second gate spacers 144' is smaller than the first thickness 142T of the first gate spacers 142. Thus, the second gate spacers 144 of FIG. 1D are tuned to a thinner thickness, thereby decreasing the distance between epitaxy structures (formed in later steps) and the channel portion of the semiconductor fin 114. In some embodiments, parts of the implantation regions 221 (see FIG. 1D) remain in the semiconductor fin 114 of the substrate 100 after the etching process 230, and the implantation regions 221' are present under the gate spacers 144.

In some embodiments, the etching process 230 is selected to form the recesses 132 and 134, and tune the second thickness 144T of the second gate spacers 144 of FIG. 1D simultaneously, but without etching the first gate spacers 142. In some embodiments, the etching process may also include a selective wet etch or a selective dry etch. A wet etching solution includes a tetramethylammonium hydroxide (TMAH), a HF/HNO$_3$/CH$_3$COOH solution, or other suitable solution. The dry and wet etching processes have etching parameters that can be tuned, such as etchants used, etching temperature, etching solution concentration, etching pressure, source power, RF bias voltage, RF bias power, etchant flow rate, and other suitable parameters. For example, a wet etching solution may include NH$_4$OH, KOH (potassium hydroxide), HF (hydrofluoric acid), TMAH (tetramethylammonium hydroxide), other suitable wet etching solutions, or combinations thereof. Dry etching processes include a biased plasma etching process that uses a chlorine-based chemistry. Other dry etchant gasses include CF$_4$, NF$_3$, SF$_6$, and He. Dry etching may also be performed anisotropically using such mechanisms as DRIE (deep reactive-ion etching).

Figure 1F:
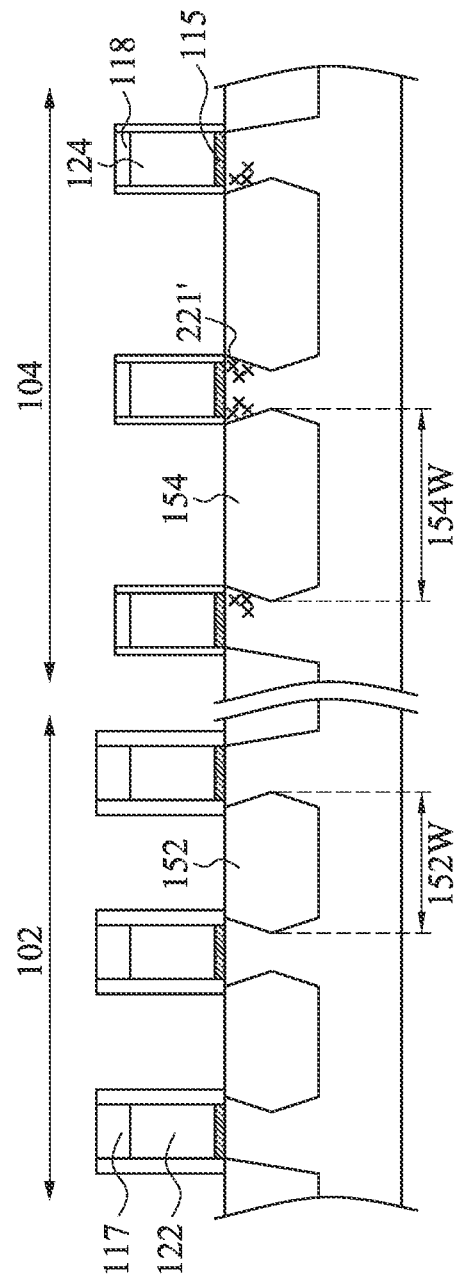

Reference is made to FIG. 1F. A plurality of source/drain features 152 and 154 are formed respectively in the recesses 132 and 134 (see FIG. 1E) of the device region 102 and 104 of the substrate 100, in which the source/drain features 152 have a width 152W, and the source/drain features 154 have a width 154W. Accordingly, the remained implantation regions 221' in the semiconductor fin 114 are adjacent to the source/drain features 154. Since the spacing between the two adjacent first dummy gates 122 is smaller than the spacing between the two adjacent second dummy gates 124, the width 152W of the source/drain features 152 is smaller than the width 154W of the source/drain features 154.

In some embodiments, the source/drain features 152 and 154 may be epitaxy structures, and the source/drain features 152 and 154 may also be referred to as epitaxy structures 152 and 154. In some embodiments, the source/drain features 152 and 154 can be n-type or p-type epitaxy structures. The source/drain features 152 and 154 may be formed using one or more epitaxy or epitaxial (epi) processes, such that Si features, SiGe features, and/or other suitable features can be formed in a crystalline state on the semiconductor fins 112 and 114. In some embodiments, lattice constants of the source/drain features 152 and 154 are different from lattice constants of the semiconductor fin 114, and the source/drain features 152 and 154 are strained or stressed to enable carrier mobility of the semiconductor device and enhance the device performance. The source/drain features 152 and 154 may include semiconductor material such as germanium (Ge) or silicon (Si); or compound semiconductor materials, such as gallium arsenide (GaAs), aluminum gallium arsenide (AlGaAs), silicon germanium (SiGe), silicon carbide (SiC), or gallium arsenide phosphide (GaAsP).

In some embodiments, for a NMOS transistor, the source/drain features 152 and 154 may include SiP, SiC, SiPC, Si, III-V compound semiconductor materials, or combinations thereof for the n-type epitaxy structure. The source/drain features 152 and 154 may have non-facet surfaces for the n-type epitaxy structure. During the formation of the n-type epitaxy structure, n-type impurities such as phosphorous or arsenic may be doped with the proceeding of the epitaxy. For example, when the source/drain features 152 and 154 include SiC or Si, n-type impurities are doped. The epitaxy processes include CVD deposition techniques (e.g., vapor-phase epitaxy (VPE) and/or ultra-high vacuum CVD (UHV-CVD)), molecular beam epitaxy, and/or other suitable processes. The epitaxy process may use gaseous and/or liquid precursors, which interact with the composition of the semiconductor fins 112 and 114 (e.g., silicon). Thus, a strained channel can be achieved to increase carrier mobility and enhance device performance. The source/drain features 152 and 154 may be in-situ doped. If the source/drain features 154 are not in-situ doped, a second implantation process (i.e., a junction implant process) is performed to dope the source/drain features 152 and 154. One or more annealing processes may be performed to activate the source/drain features 152 and 154. The annealing processes include rapid thermal annealing (RTA) and/or laser annealing processes.

Reference is made to FIG. 1G. An interlayer dielectric 170 is formed over the substrate 100 and at outer sides of the gate spacers 142 and 144', and the first masks 117 and the second masks 118 are removed. The interlayer dielectric 170 can be formed by a suitable technique, such as CVD or ALD. Then, a chemical mechanical planarization (CMP) process may be applied to remove excessive interlayer dielectric 170, the first masks 117 and the second masks 118 to expose the first dummy gates 122 and the second dummy gates 124 (see FIG. 1F). The interlayer dielectric 170 may include silicon oxide, oxynitride or other suitable materials, and may include a single layer or multiple layers. Accordingly, the interlayer dielectric 170 covers the source/drain features 152 and 154.

After the interlayer dielectric 170 is formed, a replacement gate (RPG) process scheme is employed. In some embodiments, in a RPG process scheme, a dummy gate structure is formed first and is replaced later by a metal gate after high thermal budget processes are performed. In some embodiments, the dummy gates 122, 124 and the gate dielectric 115 (shown in FIG. 1H) are removed to form a plurality of openings (not shown) between the gate spacers 142 and 144'. The dummy gates 122, 124 and the gate dielectric 115 may be removed by dry etch, wet etch, or a combination of dry and wet etch. For example, a wet etch process may include exposure to a hydroxide containing solution (e.g., ammonium hydroxide), deionized water, and/or other suitable etchant solutions.

A plurality of first gate stacks 162 and second gate stacks 164 are formed (or filled) respectively in the openings between the first gate spacers 142 and the openings between the second gate spacers 144'. In other words, the dummy gates 122, 124 and the gate dielectric 115 (see FIG. 1H) are replaced by the first gate stacks 162 and second gate stacks 164, such that the gate spacers 142 and 144' are disposed respectively on the sidewalls 162S of the first gate stacks 162 and the sidewalls 164S of the second gate stacks 164. The first gate stacks 162 are disposed on the semiconductor fin 112 of the first device region 102, and the second gate stacks 164 are disposed on the semiconductor fin 114 of the second device region 104, respectively. The materials of the first gate stacks 162 and second gate stacks 164 may be the same or may be different, and may be formed in different process. At least one of the first gate stacks 162 includes a gate dielectric 172, and a gate metal 182 formed over the gate dielectric 172. At least one of the second gate stacks 164 includes a gate dielectric 174, and a gate metal 184 formed over the gate dielectric 174. The gate dielectrics 172 and 174, as used and described herein, include dielectric materials having a high dielectric constant, for example, greater than that of thermal silicon oxide (~3.9). The gate metals 182 and 184 may include a metal, metal alloy, and/or metal silicide. Additionally, the formation of the gate stacks 162 and 164 may include depositions to form various gate materials, one or more liner layers, and one or more CMP processes to remove excessive gate materials and thereby planarize top surfaces of the gate stacks 162 and 164.

The first gate spacers 142 are disposed on opposite sidewalls 162S of the first gate stacks 162, and the second gate spacers 144 are disposed on opposite sidewalls 164S of the second gate stacks 164, respectively. The distance D3 between two adjacent first gate stacks 162 is smaller than the distance D4 between two adjacent second gate stacks 164. Moreover, due to the implantation process 220 (see FIG. 1D) and the etching process 230 (see FIG. 1E), the first thickness 142T of the first gate spacers 142 is larger than the second thickness 144T' of the second gate spacers 144'. The width 152W of the source/drain features 152 is smaller than the width 154W of the source/drain features 154.

In some other embodiments, a work function metal layer included in the gate stacks 162 and 164 may be an n-type or p-type work function layer. Exemplary p-type work function metals include TiN, TaN, Ru, Mo, Al, WN, $ZrSi_2$, $MoSi_2$, $TaSi_2$, $NiSi_2$, WN, other suitable p-type work function materials, or combinations thereof. Exemplary n-type work function metals include Ti, Ag, TaAl, TaAlC, TiAlN, TaC, TaCN, TaSiN, Mn, Zr, other suitable n-type work function materials, or combinations thereof. The work function layer may include a plurality of layers. The work function layer(s) may be deposited by CVD, PVD, electro-plating and/or other suitable process. In some embodiments, the gate stacks 162 and 164 formed is a p-type metal gate including a p-type work function layer. In some embodiments, the capping layer included in the gate stacks 162 and 164 may include refractory metals and their nitrides (e.g. TiN, TaN, WN, TiSiN, TaSiN). The capping layer may be deposited by PVD, CVD, Metal-organic chemical vapor deposition (MOCVD) and ALD.

The gate dielectrics 172 and 174 may include a high-K dielectric layer such as hafnium oxide ($HfO_2$). Alternatively, the gate dielectrics 172 and 174 may include other high-K dielectrics, such as $TiO_2$, HfZrO, $Ta_2O_3$, $HfSiO_4$, $ZrO_2$, $ZrSiO_2$, LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), combinations thereof, or other suitable material. The high-K gate dielectrics 172 and 174 may be formed by ALD, PVD, CVD, oxidation, and/or other suitable methods.

Reference is made to FIG. 1H. A plurality of first conductive features 192 and second conductive features 194 are formed respectively on the first device region 102 of the substrate 100 and the second device region 104 of the substrate 100 to form a semiconductor device 10. The first conductive features 192 are formed between two adjacent first gate stacks 162 and in contact with the source/drain features 152. The second conductive features 194 are formed between two adjacent second gate stacks 164 and in contact with the source/drain features 154.

The first conductive features 192 and second conductive features 194 may be formed by etching the interlayer dielectric 170 to form a plurality of openings (not shown) that expose the source/drain features 152 and 154. Then, metal such as tungsten is then deposited into the openings down to the source/drain features 152 and 154 to form source/drain contacts (not shown) in the interlayer dielectric 170.

According to the aforementioned embodiment, an implantation process (shown in FIG. 1D) may increase an etching rate of gate spacers and a semiconductor fin during an etching process (shown in FIG. 1E), such that a thickness of the gate spacers may be reduced. As a result, a distance between epitaxy structures and a channel portion of the semiconductor fin may be reduced accordingly, and the device speed may be improved.

FIGS. 2A to 2E are cross-sectional views of a method for manufacturing a semiconductor device at various stages in accordance with some embodiments of the present disclosure. Some details are not repeated here to avoid duplicity.

Reference is made to FIG. 2A. A substrate 100 is provided. The substrate 100 includes a semiconductor fin 112 disposed in a first device region 102 of the substrate 100, and a semiconductor fin 114 disposed in a second device region 104 of the substrate 100, respectively. A plurality of first dummy gates 122 and second dummy gates 124 are respectively disposed over the semiconductor fin 112 and the semiconductor fin 114, respectively. A plurality of first masks 117 are formed respectively on the first dummy gates 122, and a plurality of second masks 118 are formed respectively on the second dummy gates 124. A plurality of first gate spacers 142 are formed respectively on opposite sidewalls 122S of the first dummy gates 122, and a plurality of second gate spacers 144 are formed respectively on opposite sidewalls 124S of the second dummy gates 124.

The first dummy gates 122 and the second dummy gates 124 are formed such that a distance D1 between two adjacent first dummy gates 122 is smaller than a distance D2 between two adjacent second dummy gates 124. In other words, the spacing between two adjacent first dummy gates 122 is smaller than the spacing between two adjacent second dummy gates 124. In some embodiments, the distance D2 is 3% lager than the distance D1.

A plurality of first gate spacers 142 and second gate spacers 144 are formed respectively on opposite sidewalls 122S of the first dummy gates 122 and opposite sidewalls 124S of the second dummy gates 124. The first gate spacers 142 and the second gate spacers 144 have a first thickness 142T and a second thickness 144T, respectively, in which the first thickness 142T is substantially equal to the second thickness 144T. The term "substantially" as used herein may be applied to modify any quantitative representation which could permissibly vary without resulting in a change in the basic function to which it is related.

Reference is made to FIG. 2B. A mask layer 210 is formed over the first device region 102 of the substrate 100, such that the second device region 104 of the substrate 100 is exposed. In detail, the mask layer 210 covers and protects the semiconductor fin 112, the gate spacers 142, the first dummy gates 122, and first masks 117 such that the semiconductor fin 112 and the gate spacers 142.

A first etching process 250 is performed to the second device region 104 of the substrate 100. In greater detail, the first etching process 250 is performed to the second gate spacers 144 to tune the thickness 144T of the second gate spacers 144 of FIG. 2A. During the first etching process 250, the second gate spacers 144 of FIG. 2A are partially removed, such that a plurality of shrunk second gate spacers 144' having a thickness 144T' are formed, as shown in FIG. 2B. The second thickness 144T' of the shrunk second gate spacers 144' is smaller than the first thickness 142T of the first gate spacers 142. Thus, the second gate spacers 144 of FIG. 2A are tuned to a thinner thickness, thereby decreasing the distance between epitaxy structures (formed in later steps) and the channel portion of the semiconductor fin 114. In some embodiments, the second masks 118 are partially removed during the first etching process 250. In some other embodiments, the second masks 118 and the second gate spacers 144 may have etching selectivity such that the first etching process 250 is performed without etching the second masks 118.

Figure 2C:
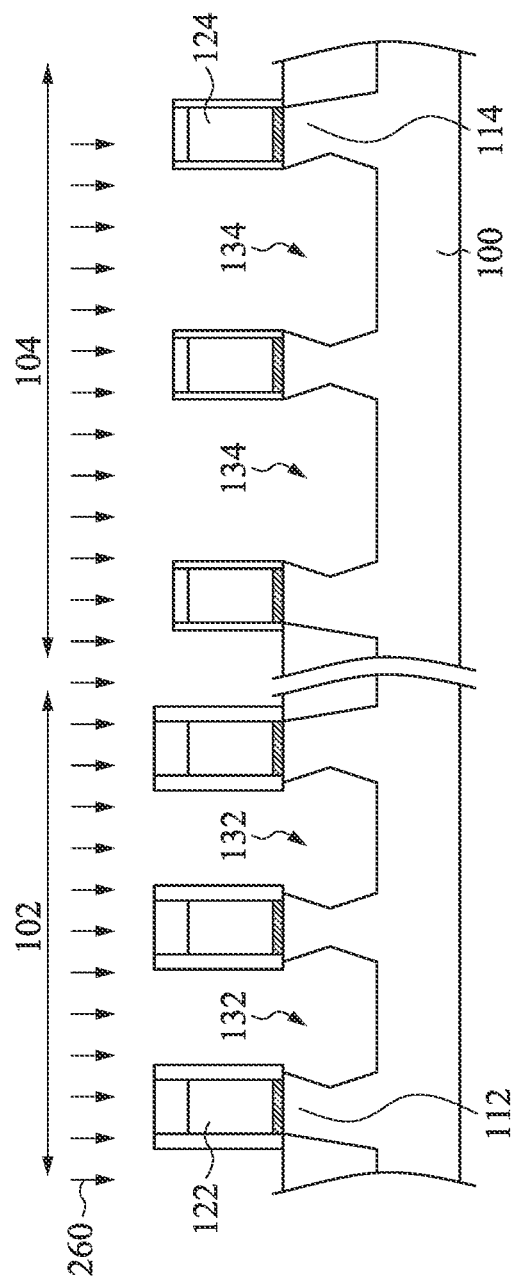

Reference is made to FIG. 2C. The mask layer 210 (see FIG. 2B) is removed to expose the first device region 102 of the substrate 100. A second etching process 260 is performed to the first device region 102 and the second device region 104 of the substrate 100. In greater detail, the second etching process 260 is performed to the semiconductor fins 112 and 114 to form a plurality of recesses 132 and 134 in the first device region 102 and the second device region 104, respectively. One of the recesses 132 having a width 132W is formed between two adjacent first dummy gates 122 and in the semiconductor fin 112 of the substrate 100, and one of the recesses 134 having a width 134W is formed between two adjacent second dummy gates 124 and in the semiconductor fin 114 of the substrate 100. Since the spacing between the two adjacent first dummy gates 122 is smaller than the spacing between the two adjacent second dummy gates 124, the width 132W of the recesses 132 is smaller than the width 134W of the recesses 134.

Figure 2D:
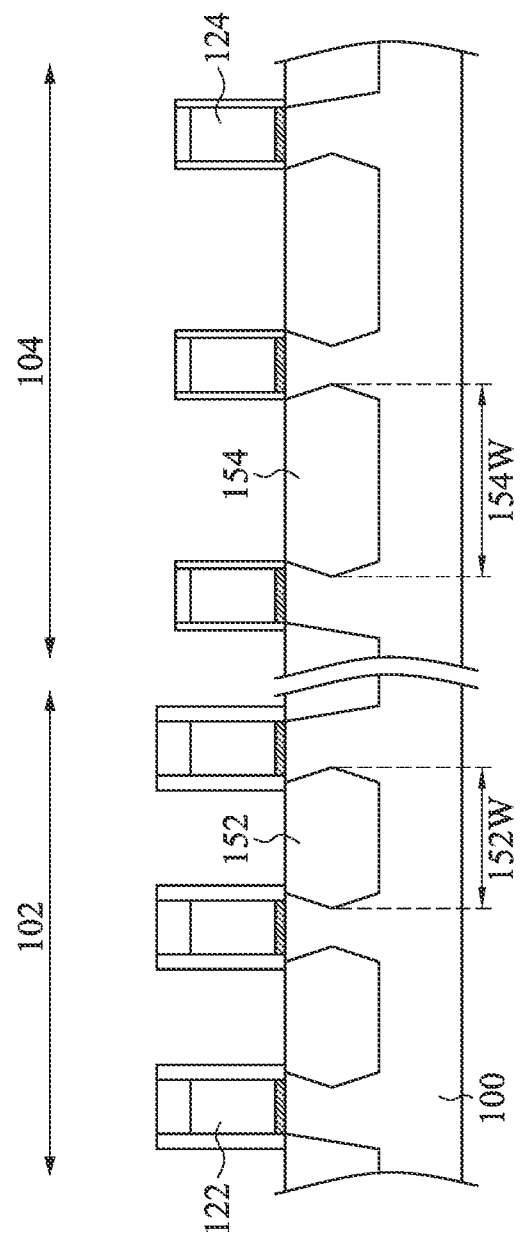

Reference is made to FIG. 2D. A plurality of source/drain features 152 and 154 are formed respectively in the recesses 132 and 134 (see FIG. 2C) of the device region 102 and 104 of the substrate 100, in which the source/drain features 152 have a width 152W, and the source/drain features 154 have a width 154W. Since the spacing between the two adjacent first dummy gates 122 is smaller than the spacing between the two adjacent second dummy gates 124, the width 152W of the source/drain features 152 is smaller than the width 154W of the source/drain features 154. In some embodiments, the source/drain features 152 and 154 may be epitaxy structures, and may also be referred to epitaxy structures 152 and 154.

Figure 2E:
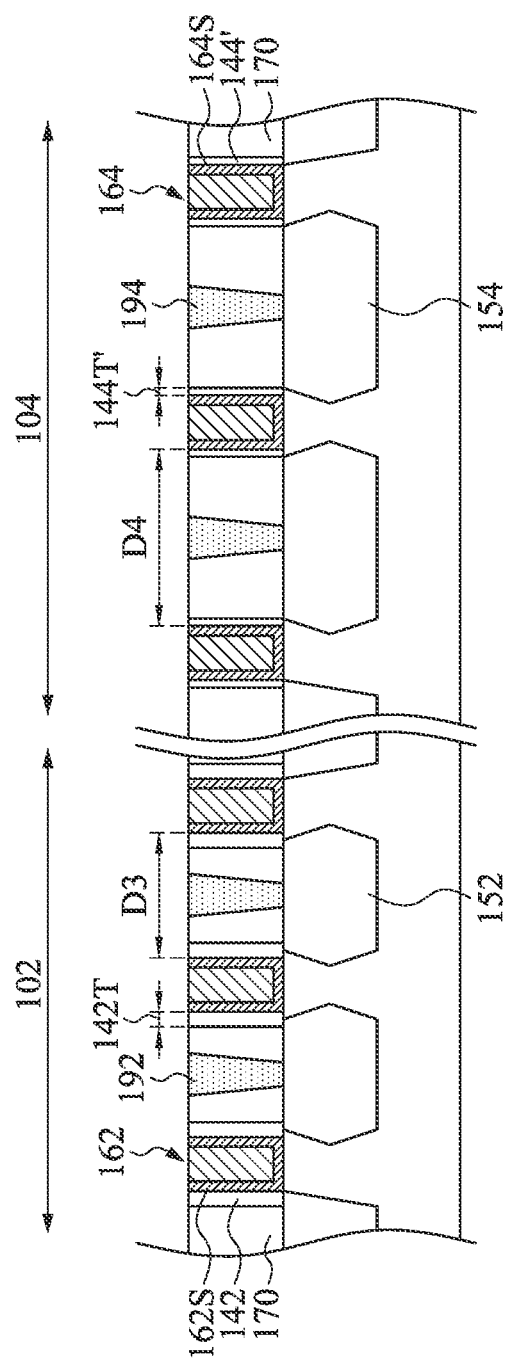

Reference is made to FIG. 2E. An interlayer dielectric 170 is formed over the substrate 100 and at outer sides of the gate spacers 142 and 144, and the first masks 117 and the second masks 118 are removed. Accordingly, the interlayer dielectric 170 covers the source/drain features 152 and 154.

After the interlayer dielectric 170 is formed, a replacement gate (RPG) process scheme is employed. In some embodiments, the dummy gates 122 and 124 (see FIG. 2E) are removed to form a plurality of openings (not shown) between the gate spacers 142 and 144. A plurality of first gate stacks 162 and second gate stacks 164 are formed respectively in the openings between the first gate spacers 142 and the openings between the second gate spacers 144. In other words, the dummy gates 122, 124 are replaced by the first gate stacks 162 and second gate stacks 164, such that the gate spacers 142 and 144 are disposed respectively on the sidewalls 162S of the first gate stacks 162 and the sidewalls 164S of the second gate stacks 164.

The first gate spacers 142 are disposed on opposite sidewalls 162S of the first gate stacks 162, and the second gate spacers 144 are disposed on opposite sidewalls 164S of the second gate stacks 164, respectively. The distance D3 between two adjacent first gate stacks 162 is smaller than the distance D4 between two adjacent second gate stacks 164. Moreover, due to the first etching process 250 (see FIG. 2B), the first thickness 142T of the first gate spacers 142 is larger than the second thickness 144T' of the second gate spacers 144'.

A plurality of first conductive features 192 and second conductive features 194 are formed respectively on the first device region 102 of the substrate 100 and the second device region 104 of the substrate 100 to form a semiconductor device 10. The first conductive features 192 are formed between two adjacent first gate stacks 162 and in contact with the source/drain features 152 (or source/drain features 152). The second conductive features 194 are formed between two adjacent second gate stacks 164 and in contact with the source/drain features 154.

FIGS. 3A to 3E are cross-sectional views of a method for manufacturing a semiconductor device at various stages in accordance with some embodiments of the present disclosure. Some details are not repeated here to avoid duplicity.

Figure 3A:
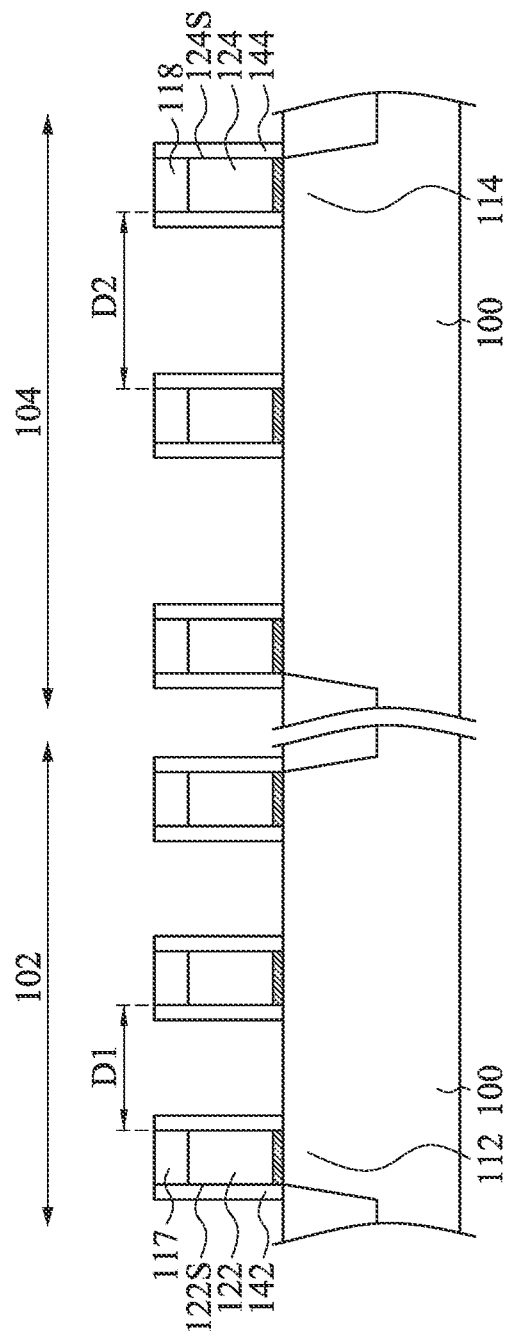

Reference is made to FIG. 3A. A substrate 100 is provided. The substrate 100 includes a semiconductor fin 112 disposed in a first device region 102 of the substrate 100, and a semiconductor fin 114 disposed in a second device region 104 of the substrate 100, respectively. A plurality of first dummy gates 122 and second dummy gates 124 are respectively disposed over the semiconductor fin 112 and the semiconductor fin 114, respectively. A plurality of first masks 117 are formed respectively on the first dummy gates 122, and a plurality of second masks 118 are formed respectively on the second dummy gates 124. A plurality of first gate spacers 142 are formed respectively on opposite sidewalls 122S of the first dummy gates 122, and a plurality of second gate spacers 144 are formed respectively on opposite sidewalls 124S of the second dummy gates 124.

A distance D1 between two adjacent first dummy gates 122 is smaller than a distance D2 between two adjacent second dummy gates 124. In other words, the spacing between two adjacent first dummy gates 122 is smaller than the spacing between two adjacent second dummy gates 124. In some embodiments, the distance D2 is 3% lager than the distance D1.

Figure 3B:
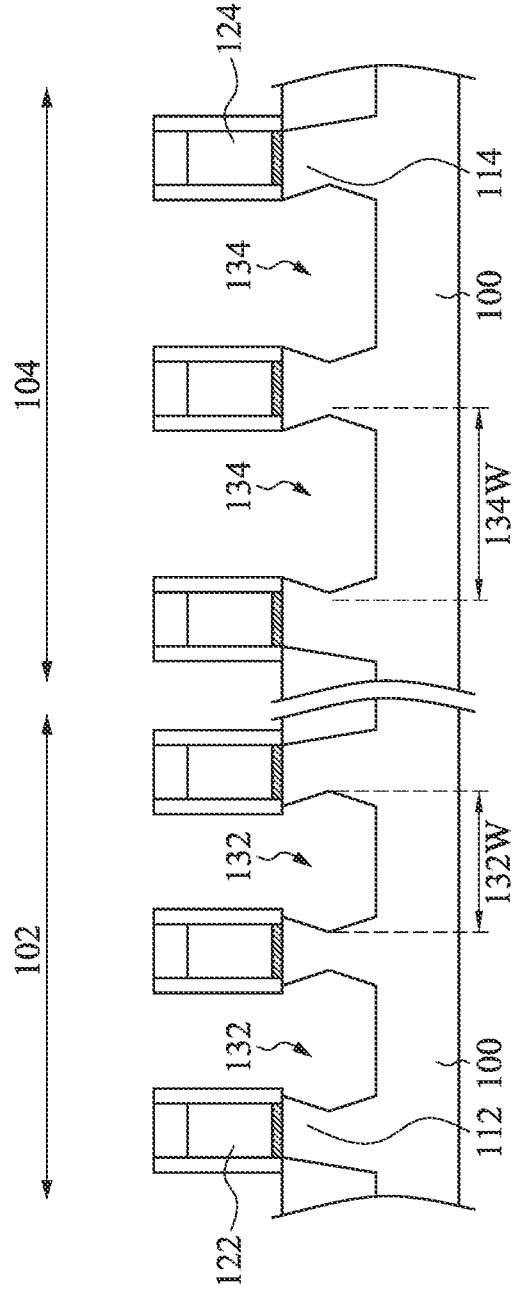

Reference is made to FIG. 3B. A plurality of first recesses 132 are formed in the semiconductor fin 112 of the substrate and between two adjacent first dummy gates 122. A plurality of second recesses 134 are formed in the semiconductor fin 114 of the substrate and between two adjacent second dummy gates 124. The first recesses 132 have a width 132W, and the second recesses 134 have a width 134W, respectively. The width 132W of the first recesses 132 is smaller than the width 134W of the second recesses 134, since the spacing between two adjacent first dummy gates 122 is smaller than the spacing between two adjacent second dummy gates 124.

Reference is made to FIG. 3C. A plurality of source/drain features 152 are formed respectively in the recesses 132 (see FIG. 3B), and a plurality of source/drain features 154 are formed respectively in the recesses 134 (see FIG. 3B). The source/drain features 152 have a width 152W, and the source/drain features 154 have a width 134W. Since the spacing between the two adjacent first dummy gates 122 is smaller than the spacing between the two adjacent second dummy gates 124, the width 152W of the source/drain features 152 is smaller than the width 154W of the source/drain features 154.

An interlayer dielectric 170 is formed over the substrate 100 and at outer sides of the gate spacers 142 and 144. A chemical mechanical planarization process is performed to remove excessive interlayer dielectric 170, the first mask 117 and the second mask 118 to expose the first dummy gates 122 and the second dummy gates 124.

Reference is made to FIG. 3D. After the interlayer dielectric 170 is formed, a replacement gate (RPG) process scheme is employed. In some embodiments, the dummy gates 122, 124 (see FIG. 3C) are removed to form a plurality of openings (not shown) between the gate spacers 142 and 144. A plurality of first gate stacks 162 and second gate stacks 164 are formed respectively in the openings between the first gate spacers 142 and the openings between the second gate spacers 144. In other words, the dummy gates 122, 124 and the gate dielectric 115 (shown in FIG. 1H) are replaced by the first gate stacks 162 and second gate stacks 164, such that the gate spacers 142 and 144 are disposed respectively on the sidewalls 162S of the first gate stacks 162 and the sidewalls 164S of the second gate stacks 164.

After the replacement gate (RPG) process, a plurality of openings 202 and 204 are formed in the interlayer dielectric 170 by suitable process(es), such as etching. In greater detail, the openings 202 are formed between two adjacent first gate stacks 162 and expose the source/drain features 152 of the first device region 102 of the substrate 100, and the openings 204 are formed between two adjacent second gate stacks 164 and expose the source/drain features 154 of the second device region 104 of the substrate 100. The openings 202 and 204 are patterned such that a width 202W of the openings 202 is smaller than a width 204W of the openings 204. Accordingly, the exposed area 152A of the source/drain features 152 is smaller than the exposed area 154A of the source/drain features 154.

Figure 3E:
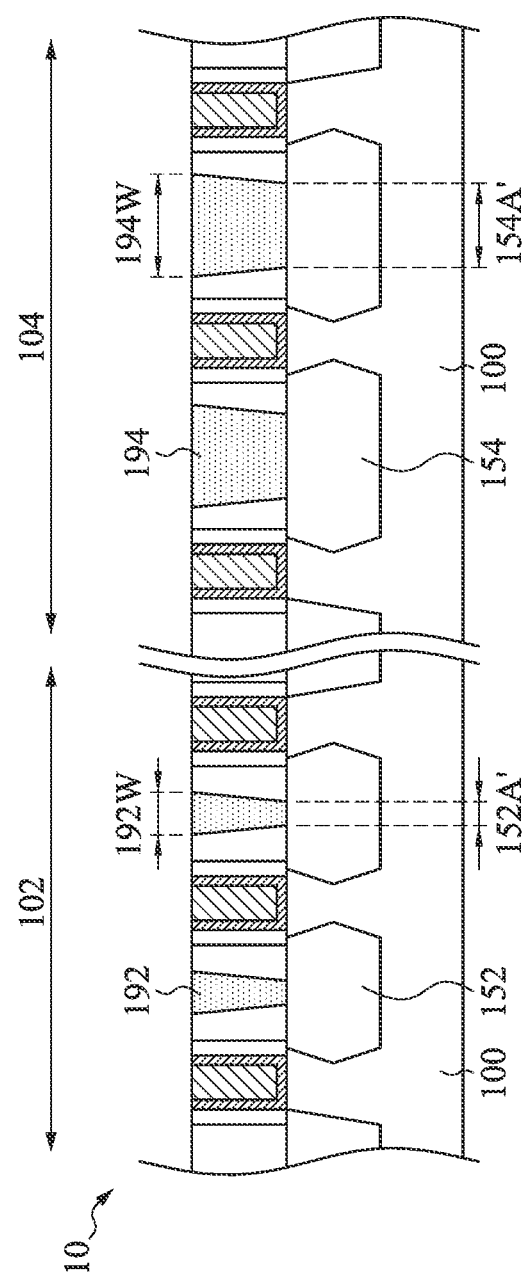

Reference is made to FIG. 3E. A plurality of first conductive features 192 and second conductive features 194 are formed respectively in the openings 202 and 204 of FIG. 3D to form a semiconductor device 10. The first conductive features 192 have a width 192W and the second conductive features 194 have a width 194W, in which the width 192W is smaller than the width 194W. The contact area 152A' between the first conductive features 192 and the source/drain features 152 is substantially equal to the exposed area 152A of the source/drain features 152 of FIG. 3D, and the contact area 154A' between the second conductive features 194 and the source/drain features 154 is substantially equal to the exposed area 154A of the source/drain features 154 of FIG. 3D. The contact area 154A' is smaller the contact area 154A'. In other words, the contact area 154A' is larger than the contact area 154A' such that the contact resistance between the second conductive features 194 and the source/drain features 154 is reduced. Thus, the device speed in the second device region 104, which has larger spacing between two adjacent gate stacks, may be improved.

According to the aforementioned embodiments, a first device region and a second device region are formed on a substrate, in which the second device region has larger gate spacing. An etching process is performed to the second device region to tune a thickness of gate spacers of gate stacks. During the etching process, the gate spacers of the gate stacks in the second device region are shrunk to a thinner thickness. Thus, a distance between a source/drain feature and a channel region in the second device region is reduced, such that the speed of the second device region, which has larger gate spacing, may be improved. Moreover, a width of conductive features in the second device region is larger than a width of conductive features in the first device region, such that the contact area between the conductive features and the source/drain feature in the second device region is increased. Therefore, the speed of the second device region, which has larger gate spacing, may be improved. With this configuration, the performance of the semiconductor device can be improved.

According to some embodiments, a device comprises a first transistor disposed within a first device region of a substrate, the first transistor comprising first source/drain regions, a first gate structure laterally between the first source/drain regions, and first gate spacers respectively on opposite sidewalls of the first gate structure; and a second transistor disposed within a second device region of the substrate, the second transistor comprising second source/drain regions, a second gate structure laterally between the second source/drain regions, and second gate spacers respectively on opposite sidewalls of the second gate structure. The second source/drain regions of the second transistor have a maximal width greater than a maximal width of the first source/drain regions of the first transistor, but the second gate spacers of the second transistor have a thickness less than a thickness of the first gate spacers. In some embodiments, top surfaces of the second source/drain regions are larger than top surfaces of the first source/drain regions. In some embodiments, bottom surfaces of the second gate spacers are smaller than bottom surfaces of the first gate spacers. In some embodiments, the first gate spacers overlap top surfaces of the first source/drain regions, but the second gate spacers do not overlap top surfaces of the second source/drain regions. In some embodiments, the device further comprises a first source/drain contact over one of the first source/drain regions; and a second source/drain contact over one of the second source/drain regions, wherein a lateral distance between the second source/drain contact and the second gate structure is greater than a lateral distance between the first source/drain contact and the first gate structure. In some embodiments, a ratio of a bottom surface area of the second source/drain contact to a top surface area of one of the second source/drain regions is smaller than a ratio of a bottom surface area of the first source/drain contact to a top surface area of one of the first source/drain regions. In some embodiments, a bottom area ratio of the second source/drain contact to the second gate spacers is smaller than a bottom area ratio of the first source/drain contact to the first gate spacers. In some embodiments, the device further comprises an ILD layer comprising a first ILD portion within the first device region and laterally surrounding the first gate spacers, and a second ILD portion within the second device region and laterally surrounding the second gate spacers, wherein the second ILD portion is wider than the first ILD portion. In some embodiments, the device further comprises a first source/drain contact extending through the first ILD portion to one of the first source/drain regions; and a second source/drain contact extending through the second ILD portion to one of the second source/drain regions, wherein a top area ratio of the second source/drain contact to the second ILD portion is smaller than a top area ratio of the first source/drain contact to the first ILD portion.

According to some embodiments, a device comprises a plurality of first gate structures disposed within a first device region of a substrate; a plurality of second gate structures disposed within a second device region of the substrate, and arranged at a larger gate-to-gate spacing than the plurality of first gate structures; a plurality of first gate spacers contacting sidewalls of the plurality of first gate structures, respectively; and a plurality of second gate spacers contacting sidewalls of the plurality of second gate structures, respectively, wherein the plurality of second gate spacers are thinner than the plurality of first gate spacers, and the substrate has an implantation species under the plurality of second gate spacers but absent under the plurality of first gate spacers. In some embodiments, the implantation species comprises nitrogen (N), fluorine (F), argon (Ar), germanium (Ge), boron (B), indium (In), carbon (C), or combinations thereof. In some embodiments, the implantation species extends to vertically below the plurality of second gate structures. In some embodiments, the device further comprises a plurality of first epitaxy structures disposed within the first device region and alternately arranged with the plurality of first gate structures; and a plurality of second epitaxy structures disposed within the second device region and alternately arranged with the plurality of second gate structures, wherein a top surface of each of the plurality of second epitaxy structures is larger than a top surface of each of the plurality of first epitaxy structures. In some embodiments, the implantation species has a bottommost position above bottom surfaces of the plurality of second epitaxy structures. In some embodiments, each of the plurality of second gate structures comprises a gate dielectric layer thicker than each of the plurality of second gate spacers. In some embodiments, the plurality of second gate spacers each have a top surface smaller than a top surface of each of the plurality of first gate spacers. In some embodiments, the gate-to-gate spacing of the plurality of second gate structures is larger than the gate-to-gate spacing of the plurality of first gate structures by at least about three percent of the gate-to-gate spacing of the plurality of first gate structures.

According to some embodiments, a device comprises a first transistor within a first device region of a substrate, the first transistor comprising a first gate structure, a first source region and a first drain region, wherein the first source region and the first drain region are on opposite sides of the first gate structure, respectively; a second transistor within a second device region of the substrate, the second transistor comprising a second gate structure, a second source region and a second drain region, wherein the second source region and the second drain region are on opposite sides of the first gate structure, respectively; a pair of first source/drain contacts over the first source region and the first drain region, respectively; and a pair of second source/drain contacts over the second source region and the second drain region, respectively, wherein the first source region and the first drain region are both narrower than the second source region and the second drain region, and the pair of first source/drain contacts is narrower than the pair of second source/drain contacts. In some embodiments, a bottom surface of each of the pair of first source/drain contacts is smaller than a bottom surface of each of the pair of the second source/drain contacts. In some embodiments, a height-to-width ratio of each of the pair of first source/drain contacts is larger than a height-to-width ration of each of the pair of second source/drain contacts.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device, comprising:
a first transistor disposed within a first device region of a substrate, the first transistor comprising first source/drain regions, a first gate structure laterally between the first source/drain regions, and first gate spacers respectively directly contacting opposite sidewalls of the first gate structure; and
a second transistor disposed within a second device region of the substrate, the second transistor comprising second source/drain regions, a second gate structure laterally between the second source/drain regions, and second gate spacers respectively directly contacting opposite sidewalls of the second gate structure,
wherein the second source/drain regions of the second transistor have a maximal width greater than a maximal width of the first source/drain regions of the first transistor, but the second gate spacers of the second transistor have a thickness less than a thickness of the first gate spacers.

2. The device of claim 1, wherein top surfaces of the second source/drain regions are larger than top surfaces of the first source/drain regions.

3. The device of claim 1, wherein bottom surfaces of the second gate spacers are smaller than bottom surfaces of the first gate spacers.

4. The device of claim 1, wherein the first gate spacers overlap top surfaces of the first source/drain regions, but the second gate spacers do not overlap top surfaces of the second source/drain regions.

5. The device of claim 1, further comprising:
a first source/drain contact over one of the first source/drain regions; and
a second source/drain contact over one of the second source/drain regions, wherein a lateral distance between the second source/drain contact and the second gate structure is greater than a lateral distance between the first source/drain contact and the first gate structure.

6. The device of claim 5, wherein a ratio of a bottom surface area of the second source/drain contact to a top surface area of one of the second source/drain regions is smaller than a ratio of a bottom surface area of the first source/drain contact to a top surface area of one of the first source/drain regions.

7. The device of claim 5, wherein a bottom area ratio of the second source/drain contact to the second gate spacers is smaller than a bottom area ratio of the first source/drain contact to the first gate spacers.

8. The device of claim 1, further comprising:
an interlayer dielectric (ILD) layer comprising a first ILD portion within the first device region and laterally surrounding the first gate spacers, and a second ILD portion within the second device region and laterally surrounding the second gate spacers, wherein the second ILD portion is wider than the first ILD portion.

9. The device of claim 8, further comprising:
a first source/drain contact extending through the first ILD portion to one of the first source/drain regions; and
a second source/drain contact extending through the second ILD portion to one of the second source/drain regions,
wherein a top area ratio of the second source/drain contact to the second ILD portion is smaller than a top area ratio of the first source/drain contact to the first ILD portion.

10. A device, comprising:
a plurality of first gate structures disposed within a first device region of a substrate;
a plurality of second gate structures disposed within a second device region of the substrate, and arranged at a larger gate-to-gate spacing than the plurality of first gate structures;
a plurality of first gate spacers directly contacting sidewalls of the plurality of first gate structures, respectively; and
a plurality of second gate spacers directly contacting sidewalls of the plurality of second gate structures, respectively,
wherein the plurality of second gate spacers are thinner than the plurality of first gate spacers, and the substrate has an implantation species under the plurality of second gate spacers but absent under the plurality of first gate spacers.

11. The device of claim 10, wherein the implantation species comprises nitrogen (N), fluorine (F), argon (Ar), germanium (Ge), boron (B), indium (In), carbon (C), or combinations thereof.

12. The device of claim 10, wherein the implantation species extends to vertically below the plurality of second gate structures.

13. The device of claim 10, further comprising:
a plurality of first epitaxy structures disposed within the first device region and alternately arranged with the plurality of first gate structures; and
a plurality of second epitaxy structures disposed within the second device region and alternately arranged with the plurality of second gate structures, wherein a top surface of each of the plurality of second epitaxy structures is larger than a top surface of each of the plurality of first epitaxy structures.

14. The device of claim 13, wherein the implantation species has a bottommost position above bottom surfaces of the plurality of second epitaxy structures.

15. The device of claim 10, wherein each of the plurality of second gate structures comprises a gate dielectric layer thicker than each of the plurality of second gate spacers.

16. The device of claim 10, wherein the plurality of second gate spacers each have a top surface smaller than a top surface of each of the plurality of first gate spacers.

17. The device of claim 10, wherein the gate-to-gate spacing of the plurality of second gate structures is larger than the gate-to-gate spacing of the plurality of first gate structures by at least about three percent of the gate-to-gate spacing of the plurality of first gate structures.

18. A device, comprising:
a first transistor within a first device region of a substrate, the first transistor comprising a first gate structure, a first source region, a first drain region, and first gate spacers, wherein the first source region and the first drain region are on opposite sides of the first gate structure and are spaced from the first gate structure by the first gate spacers, respectively;
a second transistor within a second device region of the substrate, the second transistor comprising a second gate structure, a second source region a second drain region, and second gate spacers, wherein the second source region and the second drain region are on opposite sides of the second gate structure and spaced from the second gate structure by the second gate spacers, respectively, wherein the first gate spacers overlap top surfaces of the first source region and the first drain region, but the second gate spacers do not overlap top surfaces of the second source region and the second drain regions;
a pair of first source/drain contacts over the first source region and the first drain region, respectively; and
a pair of second source/drain contacts over the second source region and the second drain region, respectively, wherein the first source region and the first drain region are both narrower than the second source region and the second drain region.

19. The device of claim 18, wherein a bottom surface of each of the pair of first source/drain contacts is smaller than a bottom surface of each of the pair of second source/drain contacts.

20. The device of claim 18, wherein a height-to-width ratio of each of the pair of first source/drain contacts is larger than a height-to-width ration of each of the pair of second source/drain contacts.

\* \* \* \* \*